(12) United States Patent
Iwakaji et al.

(10) Patent No.: US 10,811,524 B2
(45) Date of Patent: Oct. 20, 2020

(54) SEMICONDUCTOR CIRCUIT AND CONTROL CIRCUIT

(71) Applicants: Kabushiki Kaisha Toshiba, Minato-ku, Tokyo (JP); Toshiba Electronic Devices & Storage Corporation, Minato-ku, Tokyo (JP)

(72) Inventors: Yoko Iwakaji, Meguro Tokyo (JP); Tomoko Matsudai, Shibuya Tokyo (JP); Takeshi Suwa, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/284,091

(22) Filed: Feb. 25, 2019

(65) Prior Publication Data
US 2020/0091326 A1    Mar. 19, 2020

(30) Foreign Application Priority Data
Sep. 19, 2018   (JP) .................................. 2018-175440

(51) Int. Cl.
*H01L 29/76* (2006.01)
*H01L 29/739* (2006.01)
(Continued)

(52) U.S. Cl.
CPC ...... *H01L 29/7397* (2013.01); *H01L 29/0804* (2013.01); *H01L 29/0821* (2013.01);
(Continued)

(58) Field of Classification Search
USPC ........................................................ 257/288
See application file for complete search history.

(56) References Cited

U.S. PATENT DOCUMENTS

| | | | |
|---|---|---|---|
| 8,994,147 B2 | 3/2015 | Hussein et al. | |
| 9,324,848 B2 | 4/2016 | Sumitomo et al. | |
| (Continued) | | | |

FOREIGN PATENT DOCUMENTS

| | | | |
|---|---|---|---|
| JP | 3288218 B2 | 6/2002 | |
| JP | 2010-109545 A | 5/2010 | |
| (Continued) | | | |

*Primary Examiner* — Niki H Nguyen
(74) *Attorney, Agent, or Firm* — White & Case LLP

(57) ABSTRACT

A semiconductor circuit of an embodiment includes semiconductor device and a control circuit. The semiconductor device includes a semiconductor layer that has a first region of a first-conductivity type, a second region of a second-conductivity type, a third region of the first-conductivity type, fourth region of the second-conductivity type, first and second trench, first and second gate electrode, a first gate insulating film in contact with the fourth region, and a second gate insulating film spaced away from the fourth region. The semiconductor device includes a first gate electrode pad connected to the first gate electrode, and a second gate electrode pad connected to the second gate electrode. Prior to changing a first gate voltage from a turn-ON voltage to a turn-OFF voltage, a second gate voltage changed from a first voltage to a second voltage. The second voltage is a negative voltage when the first-conductivity type is p-type.

13 Claims, 12 Drawing Sheets

(51) Int. Cl.
*H01L 29/08* (2006.01)
*H01L 29/417* (2006.01)
*H01L 29/10* (2006.01)
*H01L 29/423* (2006.01)

(52) U.S. Cl.
CPC .... *H01L 29/1004* (2013.01); *H01L 29/41708* (2013.01); *H01L 29/4236* (2013.01)

(56) References Cited

U.S. PATENT DOCUMENTS

| | | | |
|---|---|---|---|
| 2014/0145239 A1* | 5/2014 | Oki | H01L 29/7397 257/139 |
| 2014/0209972 A1 | 7/2014 | Sumitomo et al. | |
| 2015/0129927 A1* | 5/2015 | Sumitomo | H01L 29/4238 257/139 |
| 2016/0079235 A1* | 3/2016 | Matsudai | H01L 29/1095 257/140 |
| 2017/0025410 A1* | 1/2017 | Cheng | H01L 27/0727 |
| 2017/0103894 A1* | 4/2017 | Aichinger | H01L 21/0475 |
| 2018/0294258 A1* | 10/2018 | Kamibaba | H01L 29/407 |

FOREIGN PATENT DOCUMENTS

| | | | |
|---|---|---|---|
| JP | 2012-238715 A | 12/2012 | |
| JP | 5742672 B2 | 7/2015 | |
| JP | 2016-063169 A | 4/2016 | |
| JP | 6064371 B2 | 1/2017 | |

\* cited by examiner

SEMICONDUCTOR CIRCUIT AND CONTROL CIRCUIT

CROSS-REFERENCE TO RELATED APPLICATION

This application is based upon and claims the benefit of priority from Japanese Patent Application No. 2018-175440, filed on Sep. 19, 2018, the entire contents of which are incorporated herein by reference.

FIELD

Embodiments described herein relate generally to a semiconductor circuit and control circuit.

BACKGROUND

An example of power semiconductor devices is an insulated-gate bipolar transistor (IGBT). In an IGBT, for example, a p-type collector region, an n-type drift region, and a p-type base region are provided on a collector electrode. A gate electrode is provided in a trench penetrating through the p-type base region and reaching into the n-type drift region. The gate insulating film is interposed between the gate electrode and the p-type base region. Further, in a region adjacent to the trench at the surface of the p-type base region, an n-type emitter region is provided connected to an emitter electrode.

In such an IGBT, as a result of applying a positive voltage greater than or equal to the threshold voltage to the gate electrode, a channel is formed in the p-type base region. At the same time as when electrons are injected into the n-type drift region from the n-type emitter region, holes are injected into the n-type drift region from the collector region. As a result, current flows between the collector electrode and the emitter electrode using both electrons and holes as carriers.

In order to reduce the on-resistance of the IGBT, it is effective to increase the carrier concentration in the n-type drift region in the ON state. However, when the IGBT is turned OFF, if carrier ejection from the n-type drift region is slow, the turn-OFF time becomes longer, and switching loss is increased. Double gate driving has been proposed as a method to realize both the reduction of on-resistance and the reduction of switching loss. Double gate driving is a technique in which a gate drive system is configured as two systems and the drive timing of two gates is changed such that the switching time of the IGBT is shortened and switching loss is reduced. Accordingly, it is possible to realize both the reduction of on-resistance and the reduction of switching loss.

DETAILED DESCRIPTION

Figure 1:
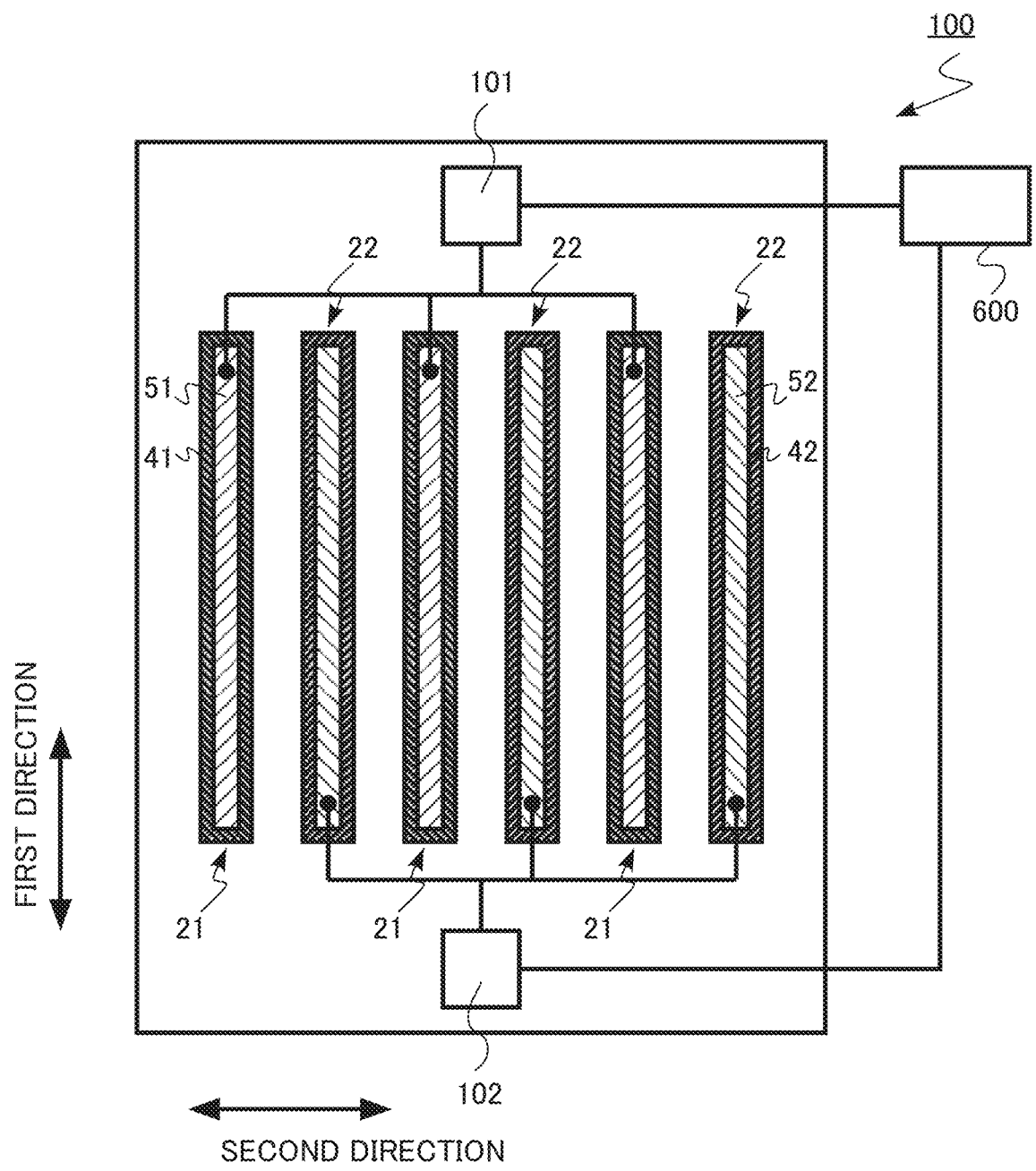
FIG. 1 is a schematic diagram of a semiconductor circuit of a first embodiment.

Description follows regarding embodiments of the present disclosure, with reference to the drawings. Note that in the following description, identical or similar members and the like may be denoted using the same reference numerals, and once described, duplicate description of members and the like may be omitted as appropriate.

In the present specification, the denotations $n^+$-type, n-type, and $n^-$-type refer to sequentially lower concentrations of n-type impurities in sequence from $n^+$-type, n-type, to $n^-$-type. The denotations $p^+$-type, p-type, and $p^-$-type also refer to sequentially lower concentrations of p-type impurities in sequence from $p^+$-type, p-type, to $p^-$-type.

In the present specification, "depth" is defined as depth in a direction from a first plane P1 toward a second plane P2.

First Embodiment

A semiconductor circuit of a first embodiment includes a semiconductor device and a control circuit. The semiconductor device includes a semiconductor layer having a first plane and a second plane opposing the first plane, the semiconductor layer including, a first semiconductor region of a first-conductivity type, a second semiconductor region of a second-conductivity type provided between the first semiconductor region and the first plane, a third semiconductor region of the first-conductivity type provided between the second semiconductor region and the first plane, a fourth semiconductor region of the second-conductivity type provided between the third semiconductor region and the first plane, a first trench penetrating through the third semiconductor region and reaching into the second semiconductor region, a first gate electrode provided in the first trench, a first gate insulating film provided between the first gate electrode and the fourth semiconductor region, between the first gate electrode and the third semiconductor region, between the first gate electrode and the second semiconductor region, the first gate insulating film being in contact with the fourth semiconductor region, a second trench penetrating through the third semiconductor region and reaching into the second semiconductor region, and a second gate electrode provided in the second trench, a second gate insulating film provided between the second gate electrode and the third semiconductor region between the second gate electrode and the second semiconductor region, the second gate insulating film being spaced away from the fourth semiconductor region. Further, the semiconductor device includes a first electrode provided on a side of the first plane of the semiconductor layer and the first electrode being electrically connected to the fourth semiconductor region; a second electrode provided on a side of the second plane of the semiconductor layer and the second electrode being electrically connected to the first semiconductor region; a first gate electrode pad provided on the side of the first plane of the semiconductor layer, the first gate electrode pad being electrically connected to the first gate electrode, and a first gate voltage being applied to the first gate electrode pad; and a second gate electrode pad provided on the side of the first plane of the semiconductor layer, the second gate electrode pad being electrically connected to the second gate electrode, and a second gate voltage being applied to the second gate electrode pad. The control circuit configured to drive the semiconductor device, prior to changing the first gate voltage from a turn-ON voltage to a turn-OFF voltage by the control circuit, the second gate voltage being changed from a first voltage to a second voltage by the control circuit, the second voltage being a negative voltage in cases where the first-conductivity type being p-type, and the second voltage being a positive voltage in cases where the first-conductivity type being n-type.

Figure 2:
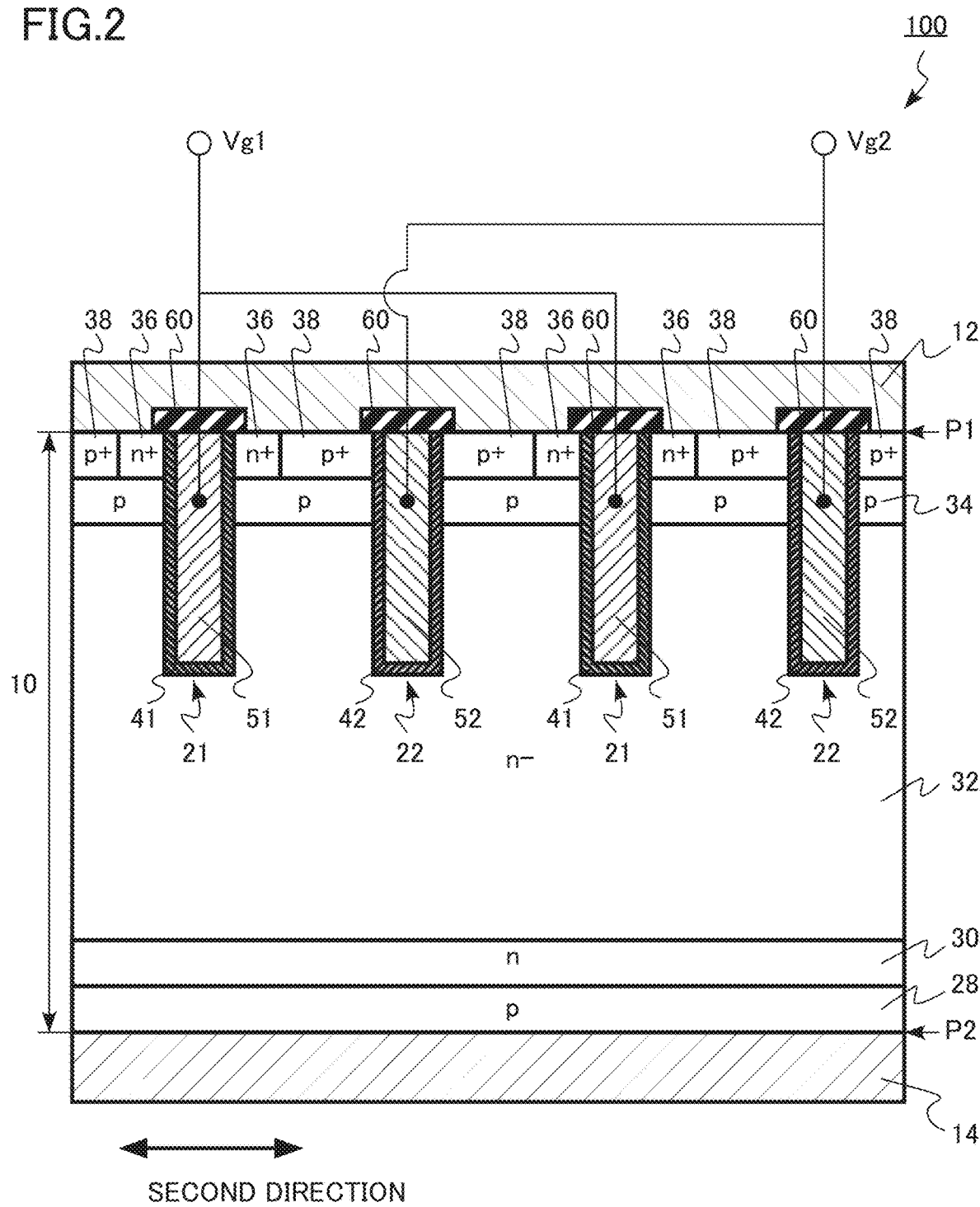
FIG. 2 is a schematic cross-sectional view of part of the semiconductor device of the first embodiment.
Figure 3:
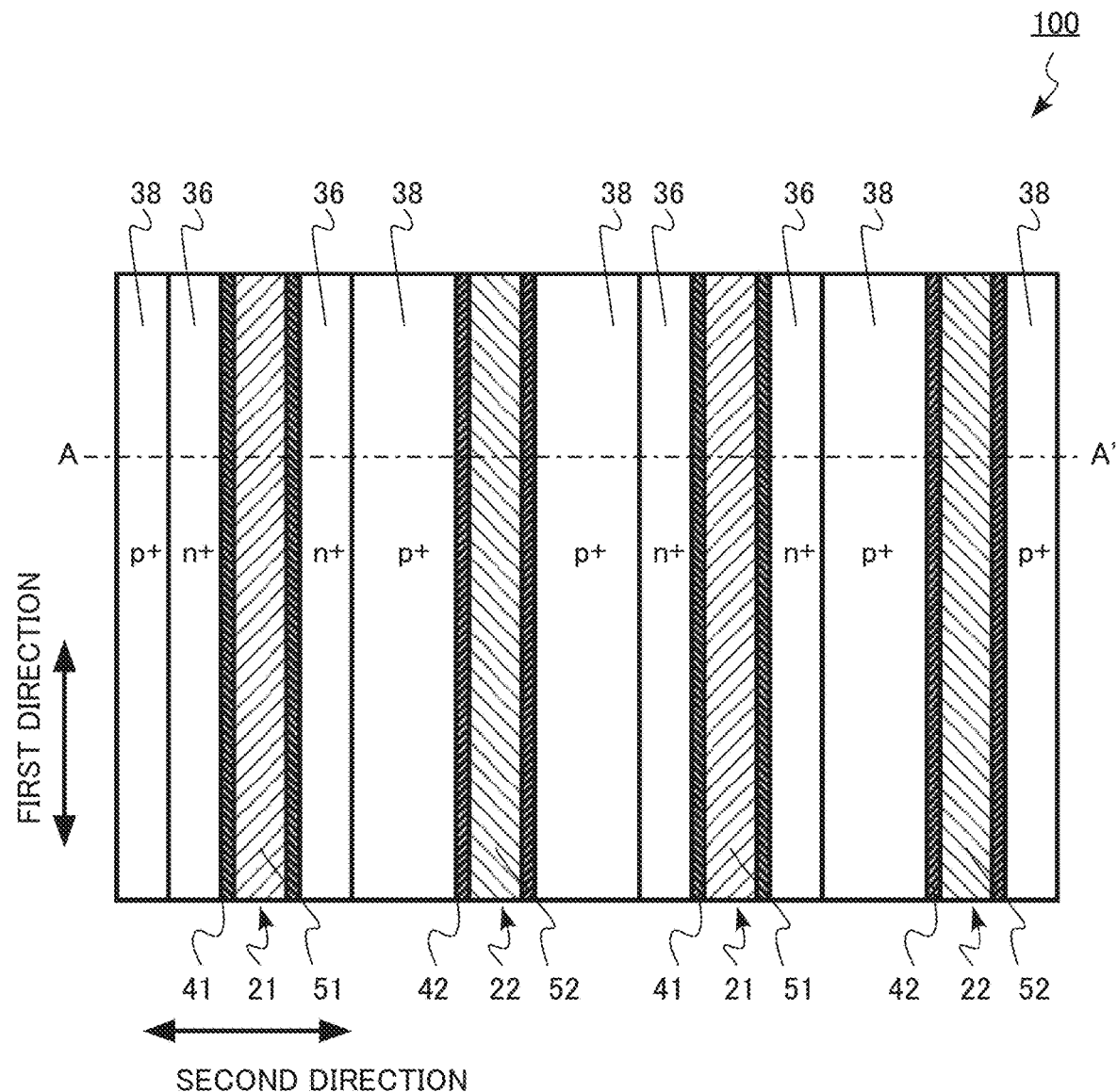
FIG. 3 is a schematic top view of part of the semiconductor device of the first embodiment.

FIG. 1 is a schematic diagram of a semiconductor circuit of the first embodiment. FIG. 1 illustrates the disposition and connection relationships between first trenches, second trenches, first gate electrodes, second gate electrodes, a first gate electrode pad, a second gate electrode pad, and control circuit connected to the first gate electrode pad and the second gate electrode pad. FIG. 2 is a schematic cross-sectional view of part of the semiconductor device of the first embodiment. FIG. 3 is a schematic top view of part of the semiconductor device of the first embodiment. FIG. 3 is a top view of the first plane P1. FIG. 2 is a cross-section along AA' in FIG. 3.

The semiconductor circuit IGBT 100 and the control circuit 600. The IGBT 100 of the first embodiment is a trench-gate IGBT provided with gate electrodes in trenches formed in a semiconductor layer. The semiconductor device of the first embodiment is an IGBT 100 with double gate driven configuration. In the following, an example will be described in which a first-conductivity type is p-type, and a second-conductivity type is n-type. The control circuit 600 drives the IGBT 100.

The IGBT 100 of the first embodiment is provided with a semiconductor layer 10, an emitter electrode 12 (first electrode), a collector electrode 14 (second electrode), insulating layers 60, a first gate electrode pad 101, and a second gate electrode pad 102.

First gate trenches 21 (first trenches), second gate trenches 22 (second trenches), a collector region 28 (first semiconductor region), a buffer region 30, a drift region 32 (second semiconductor region), a base region 34 (third semiconductor region), emitter regions 36 (fourth semiconductor regions), contact regions 38, first gate insulating films 41, second gate insulating films 42, first gate electrodes 51, and second gate electrodes 52 are provided in the semiconductor layer 10.

The semiconductor layer 10 has a first plane P1 and a second plane P2 opposing the first plane P1. The semiconductor layer 10 is, for example, single crystal silicon. The thickness of the semiconductor layer 10 is, for example, from 40 μm to 700 μm.

The emitter electrode 12 is provided on the first plane P1 side of the semiconductor layer 10. At least part of the emitter electrode 12 is in contact with the first plane P1 of the semiconductor layer 10. The emitter electrode 12 is, for example, a metal.

The emitter electrode 12 is electrically connected to the emitter regions 36 and the contact regions 38. An emitter voltage may be applied to the emitter electrode 12. The emitter voltage is, for example, 0 V.

The collector electrode 14 is provided on the second plane P2 side of the semiconductor layer 10. At least part of the collector electrode 14 is in contact with the second plane P2 of the semiconductor layer 10. The collector electrode 14 is, for example, a metal.

The collector electrode 14 is electrically connected to the p-type collector region 28. A collector voltage may be applied to the collector electrode 14. The collector voltage is, for example, from 200 V to 6500 V.

The collector region 28 is a p-type semiconductor region. The collector region 28 is electrically connected to the collector electrode 14. The collector region 28 is in contact with the collector electrode 14.

The collector region 28 is a source for holes when the IGBT 100 is in an ON state.

The buffer region 30 is an n-type semiconductor region. The buffer region 30 is provided between the collector region 28 and the first plane P1. The buffer region 30 has a function to suppress extension of the depletion layer when the IGBT 100 is in an OFF state. Configuration may also be such that no buffer region 30 is provided.

The drift region 32 is an n$^-$-type semiconductor region. The drift region 32 is provided between the collector region 28 and the first plane P1. The drift region 32 is provided between the buffer region 30 and the first plane P1. The concentration of n-type impurities in the drift region 32 is lower than the concentration of n-type impurities in the buffer region 30.

The drift region 32 is a path for ON current when the IGBT 100 is in the ON state. The drift region 32 is depleted when the IGBT 100 is in the OFF state, and has a function to maintain the breakdown voltage of the IGBT 100.

The base region 34 is a p-type semiconductor region. The base region 34 is provided between the drift region 32 and the first plane P1. The depth of the base region 34 in a direction from the first plane P1 toward the second plane P2 is, for example, less than or equal to 6 μm. When the IGBT 100 is in the ON state, an inversion layer is formed in the base region 34 and the base region 34 functions as a transistor channel region.

The emitter regions 36 are n$^+$-type semiconductor regions. The emitter regions 36 are provided between the base region 34 and the first plane P1. The emitter regions 36 extend along a first direction at the first plane P1.

The emitter regions 36 are in contact with the first gate insulating films 41. The emitter regions 36 are spaced away from the second gate insulating films 42. The emitter regions 36 are separated from the second gate insulating films 42. The emitter regions 36 are not in contact with the second gate insulating films 42. The concentration of n-type impurities in the emitter regions 36 is higher than the concentration of n-type impurities in the drift region 32.

The emitter regions 36 are electrically connected to the emitter electrode 12. The emitter regions 36 are in contact with the emitter electrode 12. The emitter regions 36 are a source for electrons when a transistor including the first gate electrodes 51 is in an ON state.

The contact regions 38 are p$^+$-type semiconductor regions. The contact regions 38 are provided between the base region 34 and the first plane P1. The contact regions 38 extend along the first direction at the first plane P1. The contact regions 38 are electrically connected to the emitter electrode 12.

As illustrated in FIG. 3, the first gate trenches 21 extend along the first direction parallel to the first plane P1 at the first plane P1. The first gate trenches 21 have stripe shapes.

A plurality of the first gate trenches 21 are disposed repeating in a second direction orthogonal to the first direction.

The first gate trenches 21 penetrate through the base region 34 and reach into the drift region 32. The depth of the first gate trenches 21 is, for example, from 4 μm to 6 μm.

The first gate electrodes 51 are provided in the first gate trenches 21. The first gate electrodes 51 are, for example, made of a semiconductor or a metal. The first gate electrodes 51 are, for example, made of amorphous silicon or polycrystalline silicon containing n-type impurities or p-type impurities. The first gate electrodes 51 are electrically connected to the first gate electrode pad 101.

The first gate insulating films 41 are provided between the first gate electrodes 51 and the semiconductor layer 10. The first gate insulating films 41 are provided between the first gate electrodes 51 and the drift region 32, between the first gate electrodes 51 and the base region 34, and between the first gate electrodes 51 and the emitter regions 36. The first gate insulating films 41 are in contact with the drift region 32, the base region 34, and the emitter regions 36. The first gate insulating films 41 are, for example, made of silicon oxide.

As illustrated in FIG. 3, the second gate trenches 22 extend along the first direction parallel to the first plane P1 at the first plane P1. The second gate trenches 22 have stripe shapes. The second gate trenches 22 are disposed repeating in the second direction orthogonal to the first direction.

The second gate trenches 22 penetrate through the base region 34 and reach into the drift region 32. The depth of the second gate trenches 22 is, for example, from 4 μm to 6 μm.

The second gate trenches 22 have, for example, the same shape as the first gate trenches 21.

The second gate electrodes 52 are provided in the second gate trenches 22. The second gate electrodes 52 are, for example, made of a semiconductor or a metal. The second gate electrodes 52 are, for example, made of amorphous silicon or polycrystalline silicon containing n-type impurities or p-type impurities. The second gate electrodes 52 are electrically connected to the second gate electrode pad 102.

The second gate insulating films 42 are provided between the second gate electrodes 52 and the semiconductor layer 10. The second gate insulating films 42 are provided between the second gate electrodes 52 and the drift region 32, between the second gate electrodes 52 and the base region 34, and between the second gate electrodes 52 and the contact regions 38. The second gate insulating films 42 are in contact with the drift region 32 and the base region 34. The second gate insulating films 42 are not in contact with the emitter regions 36. The second gate insulating films 42 are, for example, made of silicon oxide.

The insulating layers 60 are provided between the first gate electrodes 51 and the emitter electrode 12, and between the second gate electrodes 52 and the emitter electrode 12. The insulating layers 60 electrically isolate the first gate electrodes 51 and the emitter electrode 12, and electrically isolate the second gate electrodes 52 and the emitter electrode 12. The insulating layers 60 are, for example, made of silicon oxide.

The first gate electrode pad 101 is provided on the first plane P1 side of the semiconductor layer 10. The first gate electrode pad 101 is electrically connected to the first gate electrodes 51. The first gate electrode pad 101 and the first gate electrodes 51 are, for example, connected by non-illustrated metallic interconnections. A first gate voltage (Vg1) is applied to the first gate electrode pad 101. The second gate electrode pad 102 is electrically connected to the second gate electrodes 52. The second gate electrode pad 102 and the second gate electrodes 52 are, for example, connected by non-illustrated metallic interconnections. A second gate voltage (Vg2) is applied to the second gate electrode pad 102.

The control circuit 600 is electrically connected to the first gate electrode pad 101 and the second gate electrode pad 102. The control circuit 600 is electrically connected to the first gate electrode pad 101 and the second gate electrode pad 102 by using metal wires (not shown in the drawings), for example. The control circuit 600 drives the IGBT 100 by controlling application timing of the first gate voltage (Vg1) applied to the first gate electrode pad 101 and the second gate voltage (Vg2) applied to the second gate electrode pad 102.

Description follows regarding a method of driving the IGBT 100.

Figure 4:
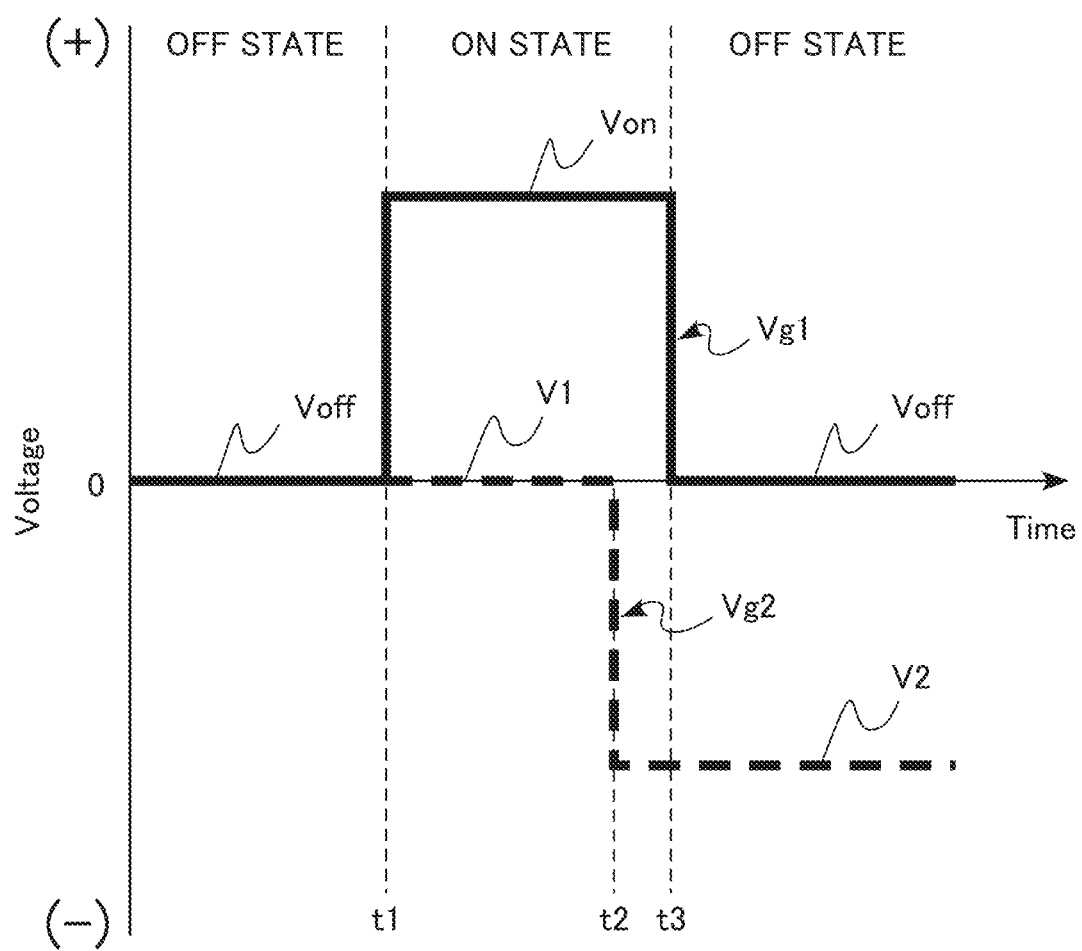
FIG. 4 is a diagram for explaining a method of driving the semiconductor device of the first embodiment.

FIG. 4 is a diagram for explaining a method of driving the semiconductor device of the first embodiment. FIG. 4 is a timing chart of application of the first gate voltage (Vg1) to the first gate electrode pad 101 and the second gate voltage (Vg2) to the second gate electrode pad 102. The application timing of the first gate voltage (Vg1) and the second gate voltage (Vg2) are controlled by the control circuit 600.

A transistor including the first gate electrodes 51 and a structure including the second gate electrodes 52 are not clearly isolated structures. However, for convenience when explaining operation, description of "a transistor including the first gate electrodes 51" will be used.

In the OFF state of the IGBT 100, for example, the emitter voltage is applied to the emitter electrode 12. The emitter voltage is, for example, 0 V. A collector voltage is applied to the collector electrode 14. The collector voltage is, for example, from 200 V to 6500 V.

In the OFF state of the IGBT 100, a turn-OFF voltage (Voff) is applied to the first gate electrode pad 101. The first gate voltage (Vg1) becomes the turn-OFF voltage (Voff). Accordingly, the turn-OFF voltage (Voff) is also applied to the first gate electrodes 51.

The turn-OFF voltage (Voff) is a voltage less than the threshold voltage, for example 0 V or a negative voltage, whereby the transistor including the first gate electrodes 51 is not in the ON state.

In the OFF state, an n-type inversion layer is not formed in the base region 34 opposing the first gate electrodes 51 and in contact with the first gate insulating films 41.

In the OFF state of the IGBT 100, a first voltage (V1) is applied to the second gate electrode pad 102. The first voltage (V1) is a voltage whereby a p-type inversion layer is not formed in the drift region 32 opposing the second gate electrodes 52 and in contact with the second gate insulating films 42. The first voltage (V1) is, for example, 0 V or a positive voltage.

When the IGBT 100 is placed in the ON state (time t1 in FIG. 4), a turn-ON voltage (Von) is applied to the first gate electrode pad 101. The first gate voltage (Vg1) becomes the turn-ON voltage. The turn-ON voltage (Von) is also applied to the first gate electrodes 51.

The turn-ON voltage (Von) is a positive voltage greater than the threshold voltage of the transistor including the first gate electrodes 51. The turn-ON voltage (Von) is, for example, 15 V. As a result of application of the turn-ON voltage (Von) to the first gate electrodes 51, the transistor including the first gate electrodes 51 becomes the ON state.

The first voltage (V1) is then applied to the second gate electrode pad 102. Namely, the second gate voltage (Vg2) then becomes the first voltage (V1).

When the IGBT 100 is placed in the OFF state (time t3 in FIG. 4), the turn-OFF voltage (Voff) is applied to the first gate electrode pad 101. The first gate voltage (Vg1) becomes the turn-OFF voltage (Voff).

Prior to changing the first gate voltage (Vg1) from the turn-ON voltage (Von) to the turn-OFF voltage (Voff), namely prior to time t3, the second gate voltage (Vg2) is changed from the first voltage (V1) to a second voltage (V2). The voltage applied to the second gate electrode pad 102 is changed from the first voltage (V1) to the second voltage (V2) at time t2.

The second voltage (V2) is a negative voltage. The second voltage (V2) is, for example, greater than or equal to −15 V and less than 0 V. As a result of applying the second voltage (V2) to the second gate electrode pad 102, a p-type inversion layer is formed in the drift region 32 in contact with the second gate insulating films 42.

The amount of time (time interval) between time t2 and time t3 is, for example, equal to or more than 0.1 μs and equal to or less than 10 μs. The amount of time between time t2 and time t3 is, for example, equal to or more than 0.1 μs and equal to or less than 4 μs. The amount of time between time t2 and time t3 is, for example, equal to or more than 0.1 μs and equal to or less than 3 μs.

Next, the function and effect of the semiconductor device of the first embodiment will be described.

In order to reduce the on-resistance of an IGBT, it is effective to increase the carrier concentration in the drift region in the ON state. However, when the IGBT is turned OFF, if carrier ejection from the drift region slows, the turn-OFF interval becomes longer, and switching loss is increased. Accordingly, it is desirable to realize both the reduction of on-resistance and the reduction of switching loss.

The IGBT 100 of the first embodiment is provided with the first gate electrodes 51 in the first gate trenches 21, and with the second gate electrodes 52 in the second gate trenches 22. The first gate voltage (Vg1) applied to the first gate electrodes 51 and the second gate voltage (Vg2) applied to the second gate electrodes 52 are controlled independently.

For the IGBT 100, the second gate voltage (Vg2) is made a negative voltage prior to the first gate voltage (Vg1) being changed from the turn-ON voltage (Von) to the turn-OFF voltage (Voff). As a result of the second gate voltage (Vg2) being made a negative voltage, a p-type inversion layer may be formed in the drift region 32 opposing the second gate electrodes 52 and in contact with the second gate insulating films 42.

Holes in the drift region 32 pass through the p-type inversion layer and are ejected into the emitter electrode 12. Accordingly, there is less carrier accumulation on the first plane P1 side of the drift region 32.

When the first gate voltage (Vg1) is changed from the turn-ON voltage (Von) to the turn-OFF voltage (Voff) (time t3 in FIG. 4), since there is already less carrier accumulation on the first plane P1 side of the drift region 32, the turn-OFF time becomes shorter. Consequently, switching loss in the IGBT 100 can be reduced.

Thus, the IGBT of the first embodiment enables the reduction of switching loss.

Second Embodiment

The semiconductor circuit of the second embodiment differs from the semiconductor circuit of the first embodiment in that a fifth semiconductor region of a second-conductivity type is further provided between the second semiconductor region and the third semiconductor region in the semiconductor layer. The concentration of second-conductivity type impurities in the fifth semiconductor region is higher than the second semiconductor region. In the following, details that overlap with that for the first embodiment may be partially omitted.

Figure 5:
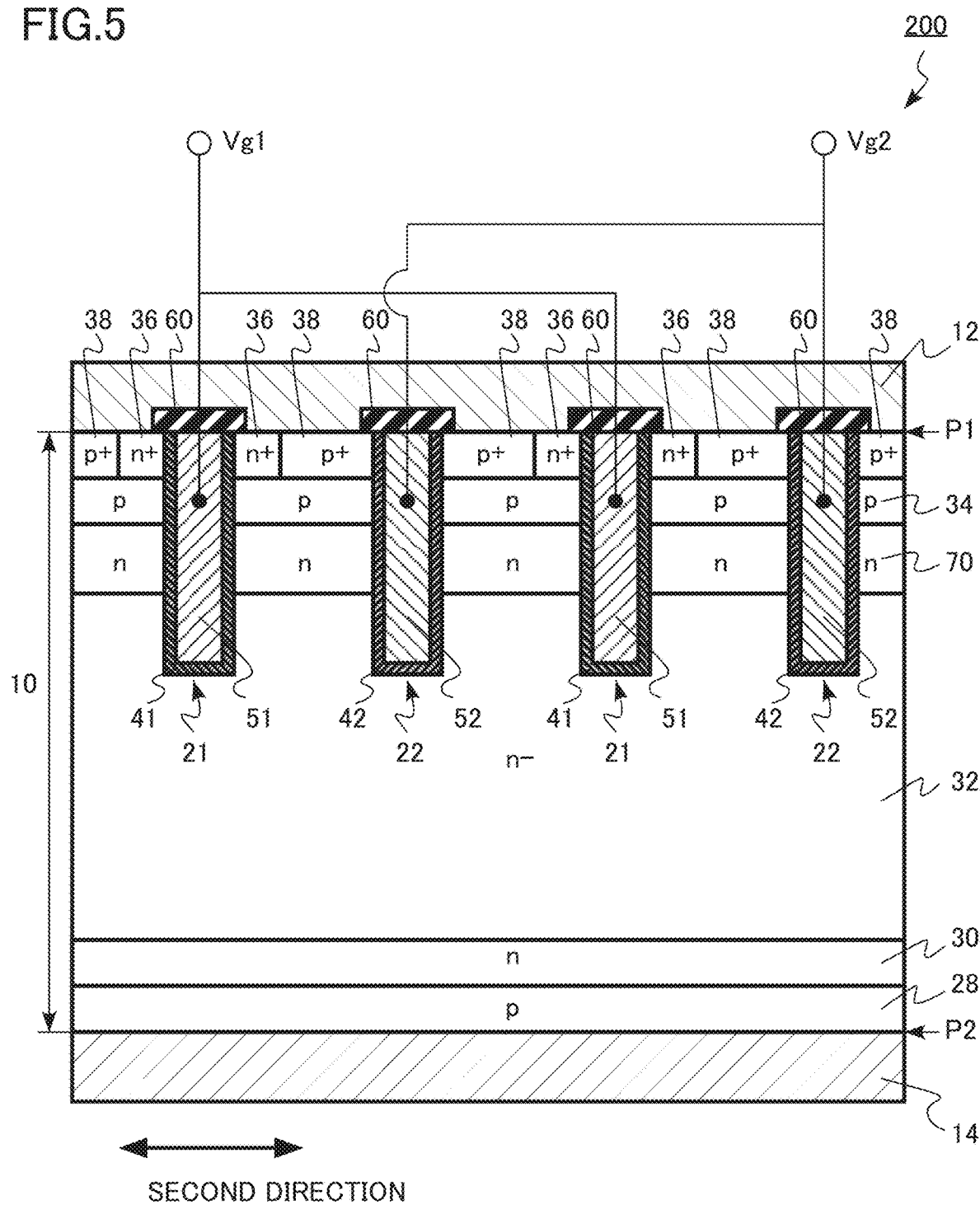
FIG. 5 is a schematic cross-sectional view of part of a semiconductor device of a second embodiment.

FIG. 5 is a schematic cross-sectional view of part of the semiconductor device of the second embodiment.

The semiconductor device of the second embodiment is a trench-gate IGBT 200 provided with gate electrodes in trenches formed in a semiconductor layer. The semiconductor device of the second embodiment is an IGBT 200 with double gate driven configuration. In the following, an example will be described in which a first-conductivity type is p-type, and a second-conductivity type is n-type.

The IGBT 200 of the second embodiment is provided with a semiconductor layer 10, an emitter electrode 12 (first electrode), a collector electrode 14 (second electrode), insulating layers 60, a first gate electrode pad 101, and a second gate electrode pad 102.

First gate trenches 21 (first trenches), second gate trenches 22 (second trenches), a collector region 28 (first semiconductor region), a buffer region 30, a drift region 32 (second semiconductor region), a base region 34 (third semiconductor region), emitter regions 36 (fourth semiconductor regions), contact regions 38, first gate insulating films 41, second gate insulating films 42, first gate electrodes 51, second gate electrodes 52, and a barrier region 70 (fifth semiconductor region) are provided in the semiconductor layer 10.

The barrier region 70 is an n-type semiconductor region. The barrier region 70 is provided between the drift region 32 and the base region 34. The concentration of n-type impurities in the barrier region 70 is higher than the concentration of n-type impurities in the drift region 32. The maximum concentration of n-type impurities in the barrier region 70 is preferably at least 100 times greater than the concentration of n-type impurities in the drift region 32.

As a result of providing the barrier region 70 having a high concentration of n-type impurities on the first plane P1 side of the drift region 32, when the IGBT 200 is in the ON state, the ejection of holes in the drift region 32 into the emitter electrode 12 is restricted. Accordingly, the carrier concentration on the first plane P1 side of the drift region is increased. Consequently, the on-resistance of the IGBT 200 is reduced.

Description follows regarding a method of driving the IGBT 200.

Figure 6:
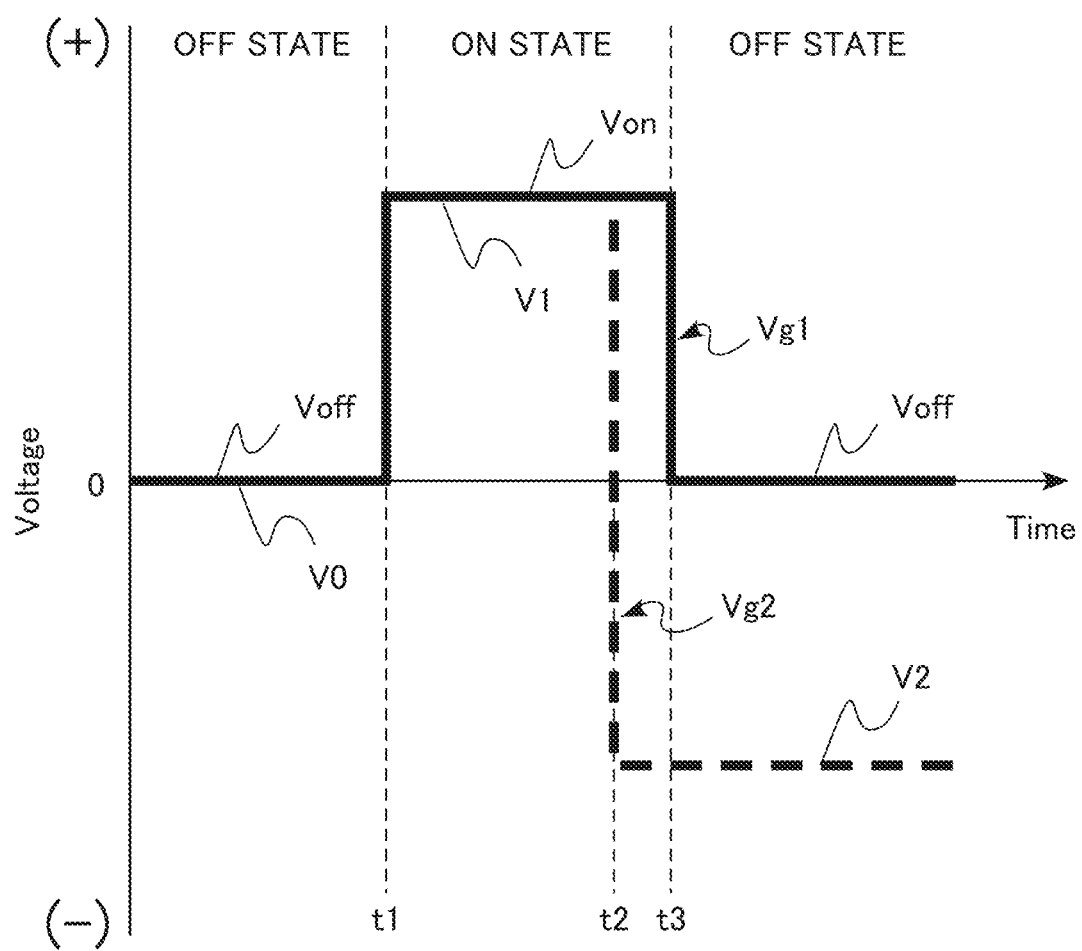
FIG. 6 is a diagram for explaining a method of driving the semiconductor device of the second embodiment.

FIG. 6 is a diagram for explaining a method of driving the semiconductor device of the second embodiment. FIG. 6 is a timing chart for application of the first gate voltage (Vg1) to the first gate electrode pad 101 and the second gate voltage (Vg2) to the second gate electrode pad 102. In the second embodiment, similar to the first embodiment, the application timing of the first gate voltage (Vg1) and the second gate voltage (Vg2) are controlled by the control circuit 600.

A transistor including the first gate electrodes 51 and a structure including the second gate electrodes 52 are not clearly isolated structures. However, for convenience when explaining operation, description "transistor including the first gate electrodes 51" will be used.

In the OFF state of the IGBT 200, for example, the emitter voltage is applied to the emitter electrode 12. The emitter voltage is, for example, 0 V. A collector voltage is applied to the collector electrode 14. The collector voltage is, for example, from 200 V to 6500 V.

In the OFF state of the IGBT 200, a turn-OFF voltage (Voff) is applied to the first gate electrode pad 101. The first gate voltage (Vg1) becomes the turn-OFF voltage (Voff). Accordingly, the turn-OFF voltage (Voff) is also applied to the first gate electrodes 51.

The turn-OFF voltage (Voff) is a voltage less than the threshold voltage, for example 0 V or a negative voltage, whereby the transistor including the first gate electrodes 51 is not in the ON state.

In the OFF state, an n-type inversion layer is not formed in the base region 34 opposing the first gate electrodes 51 and in contact with the first gate insulating films 41.

In the OFF state of the IGBT 200, an initial voltage (V0) is applied to the second gate electrode pad 102. The initial voltage (V0) is, for example, a voltage whereby a p-type inversion layer is not formed in the drift region 32 opposing the second gate electrodes 52 and in contact with the second gate insulating films 42. The initial voltage (V0) is, for example, 0 V or a positive voltage.

When the IGBT 200 is placed in the ON state (time t1 in FIG. 6), a turn-ON voltage (Von) is applied to the first gate electrode pad 101. The first gate voltage (Vg1) becomes the turn-ON voltage (Von). The turn-ON voltage (Von) is also applied to the first gate electrodes 51.

The turn-ON voltage (Von) is a positive voltage greater than the threshold voltage of the transistor including the first gate electrodes 51. The turn-ON voltage (Von) is, for example, 15 V. As a result of application of the turn-ON voltage (Von) to the first gate electrodes 51, the transistor including the first gate electrodes 51 becomes the ON state.

When the IGBT 200 is placed in the ON state (time t1 in FIG. 6), the first voltage (V1) is applied to the second gate electrode pad 102. The second gate voltage (Vg2) becomes the first voltage (V1).

The first voltage (V1) is, for example, a positive voltage greater than the initial voltage (V0). The first voltage (V1) is, for example, equal to the turn-ON voltage (Von). As a result of applying the first voltage (V1) to the second gate electrode pad 102, an n-type accumulation layer is formed in the barrier region 70 in contact with the second gate insulating films 42.

When the IGBT 200 is placed in the OFF state (time t3 in FIG. 6), the turn-OFF voltage (Voff) is applied to the first gate electrode pad 101. The first gate voltage (Vg1) becomes the turn-OFF voltage (Voff).

Prior to changing the first gate voltage (Vg1) from the turn-ON voltage (Von) to the turn-OFF voltage (Voff), namely prior to time t3, the second gate voltage (Vg2) is changed from the first voltage (V1) to a second voltage (V2). The voltage applied to the second gate electrode pad 102 is changed from the first voltage (V1) to the second voltage (V2) at time t2.

The second voltage (V2) is a negative voltage. The second voltage (V2) is, for example, greater than or equal to −15 V and less than 0 V. As a result of applying the second voltage (V2) to the second gate electrode pad 102, a p-type inversion layer may be formed in the drift region 32 in contact with the second gate insulating films 42 and in the barrier region 70 in contact with the second gate insulating films 42.

The amount of time (time interval) between time t2 and time t3 is, for example, equal to or more than 0.1 μs and equal to or less than 10 μs. The amount of time between time t2 and time t3 is, for example, equal to or more than 0.1 μs and equal to or less than 4 μs. The amount of time between time t2 and time t3 is, for example, equal to or more than 0.1 μs and equal to or less than 3 μs.

Next, the function and effect of the semiconductor device of the second embodiment will be described.

The IGBT 200 of the second embodiment is provided with the first gate electrodes 51 in the first gate trenches 21, and with the second gate electrodes 52 in the second gate trenches 22. The first gate voltage (Vg1) applied to the first gate electrodes 51 and the second gate voltage (Vg2) applied to the second gate electrodes 52 are controlled independently.

In the IGBT 200, the second gate voltage (Vg2) is made a negative voltage prior to the first gate voltage (Vg1) being changed from the turn-ON voltage (Von) to the turn-OFF voltage (Voff). As a result of the second gate voltage (Vg2) being made a negative voltage, a p-type inversion layer is formed opposing the second gate electrodes 52, in the drift region 32 in contact with the second gate insulating films 42 and in the barrier region 70 in contact with the second gate insulating films 42.

Making the second gate voltage (Vg2) a negative voltage enables a p-type inversion layer to also be formed in the barrier region 70 having a higher concentration of n-type impurities than in the drift region 32.

Holes in the drift region 32 pass through the p-type inversion layer and are ejected into the emitter electrode 12. Accordingly, there is less carrier accumulation on the first plane P1 side of the drift region 32.

When the first gate voltage (Vg1) is changed from the turn-ON voltage (Von) to the turn-OFF voltage (Voff) (time t3 in FIG. 6), since there is already less carrier accumulation on the first plane P1 side of the drift region 32, the turn-OFF time becomes shorter. Consequently, switching loss in the IGBT 200 is able to be reduced.

As described above, by providing the barrier region 70, when in the ON state, the ejection of holes in the drift region 32 into the emitter electrode 12 is restricted, and the on-resistance is reduced. Moreover, as a result of applying the first voltage (V1) to the second gate electrode pad 102, when the IGBT 200 is in the ON state, an n-type accumulation layer is formed in the barrier region 70 in contact with the second gate insulating films 42. Due to the formation of the n-type accumulation layer, the ejection of holes into the emitter electrode 12 through the barrier region 70 is further restricted. Accordingly, the on-resistance is further reduced.

In general, providing a barrier region reduces the on-resistance of an IGBT. However, since the carrier concentration in the drift region is increased, the ejection of holes from the drift region slows, and the turn-OFF interval becomes longer. In the IGBT 200 of the second embodiment, due to a p-type inversion layer also being formed in the barrier region 70 when the IGBT 200 is turned OFF, the ejection of holes from the drift region 32 is enhanced, enabling the turn-OFF time to be made shorter.

Note that in the IGBT 200 of the second embodiment, the first voltage (V1) may, for example, be set to 0 V.

Figure 7:
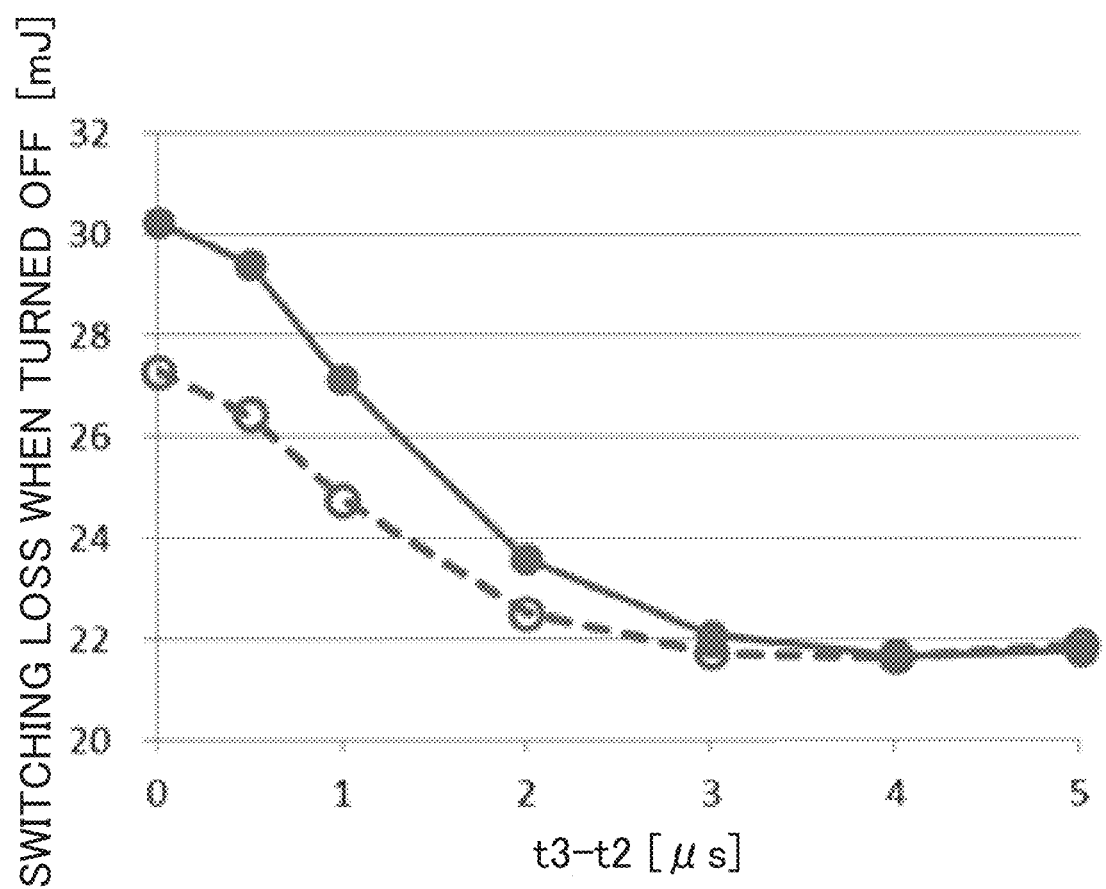
FIG. 7 is a diagram illustrating simulation results for the semiconductor device of the second embodiment.

FIG. 7 is a diagram illustrating simulation results for the semiconductor device of the second embodiment. FIG. 7 illustrates simulation results for switching loss when the IGBT 200 is turned OFF.

The horizontal axis in FIG. 7 is duration of time (t3−t2) which is duration of time from the time at which the second gate voltage (Vg2) is changed from the first voltage (V1) to the second voltage (V2) (time t2 in FIG. 6) to the time at which the first gate voltage (Vg1) is changed from the turn-ON voltage (Von) to the turn-OFF voltage (Voff) (time t3 in FIG. 6). The horizontal axis in FIG. 7 is the switching loss when the IGBT 200 is turned OFF.

Note that the dotted line is for a case where the maximum concentration of n-type impurities in the barrier region 70 is 500 times the concentration of n-type impurities in the drift region 32, and the solid line is for a case where the maximum concentration of n-type impurities in the barrier region 70 is 1500 times the concentration of n-type impurities in the drift region 32.

It is apparent that with respect to switching loss when t3−t2=0 s, or in other words, when the second gate voltage (Vg2) is changed from the first voltage (V1) to the second voltage (V2) at the same time the first gate voltage (Vg1) is changed from the turn-ON voltage (Von) to the turn-OFF voltage (Voff), switching loss is reduced by approximately 20% for t3−t2=at least 4 μs.

Further, when t3−t2=0 s, in cases where there is a high concentration of n-type impurities in the barrier region 70, although switching loss increases, for t3−t2=at least 4 μs, there is no discernable difference in switching loss due to the concentration of n-type impurities.

Thus, even in cases where a barrier region 70 is provided, the IGBT of the second embodiment enables the reduction of switching loss when the IGBT is turned OFF.

In general, when the concentration of n-type impurities in a barrier region is increased, there is a risk of destruction of the IGBT when the IGBT is turned OFF. With the IGBT 200 of the second embodiment, performing double gate drive reduces the carrier concentration in the drift region 32 ahead of time, whereby destruction when the IGBT 200 is turned OFF is suppressed.

Thus, the IGBT of the second embodiment enables the reduction of switching loss similarly to the IGBT of the first embodiment. Further, providing the barrier region 70 enables the on-resistance to be reduced.

Third Embodiment

The semiconductor circuit of the third embodiment differs from the semiconductor circuit of the second embodiment in that a sixth semiconductor region of a first-conductivity type is further provided between the second semiconductor region and the fifth semiconductor region in the semiconductor layer. In the following, details that overlap with that for the first embodiment or the second embodiment may be partially omitted.

Figure 8:
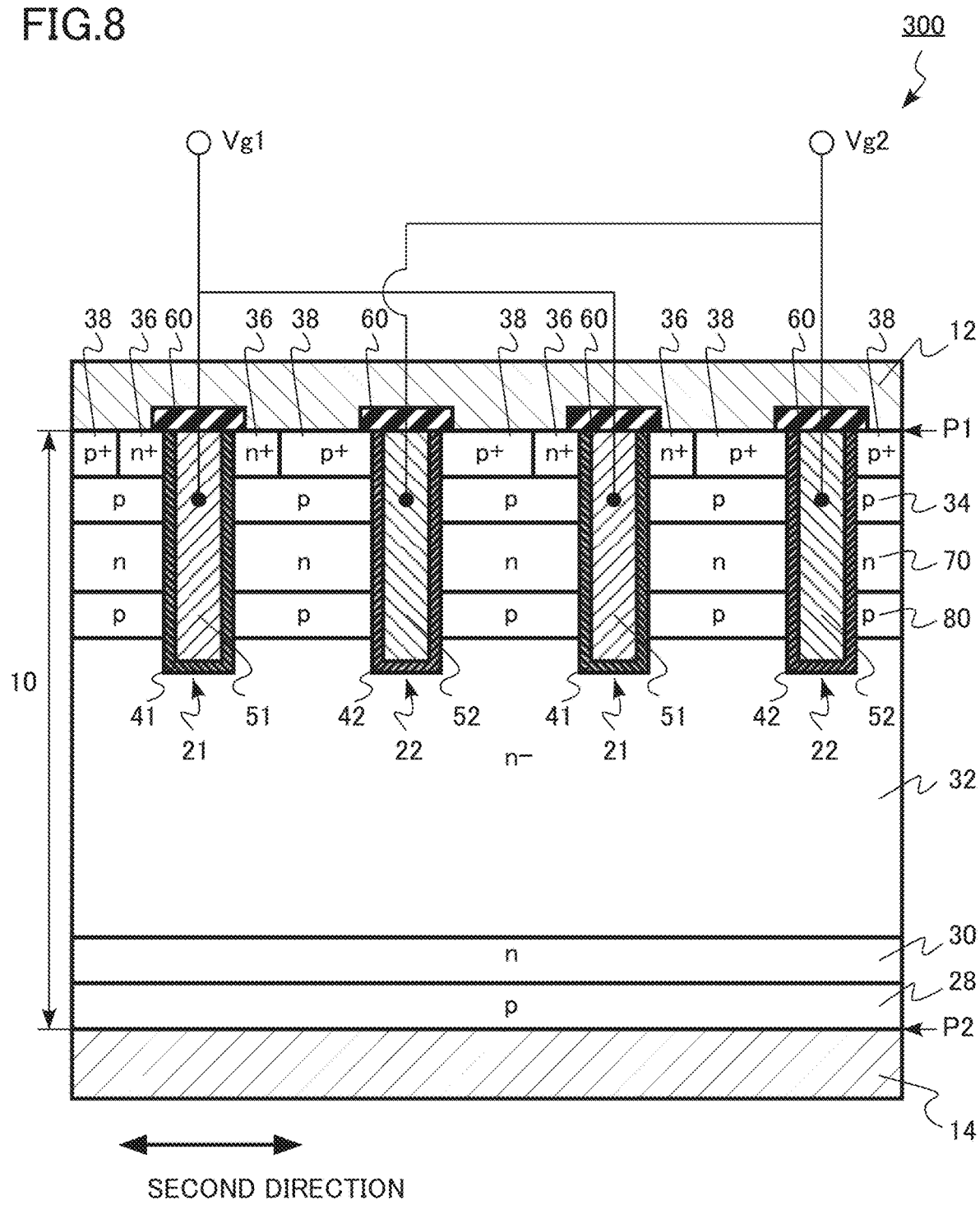
FIG. 8 is a schematic cross-sectional view of part of a semiconductor device of a third embodiment.

FIG. 8 is a schematic cross-sectional view of part of the semiconductor device of the third embodiment.

The semiconductor device of the third embodiment is a trench-gate IGBT 300 provided with gate electrodes in trenches formed in a semiconductor layer. The semiconductor device of the third embodiment is an IGBT 300 with double gate driven configuration. In the following, an example will be described in which a first-conductivity type is p-type, and a second-conductivity type is n-type.

The IGBT 300 of the third embodiment is provided with a semiconductor layer 10, an emitter electrode 12 (first electrode), a collector electrode 14 (second electrode), insulating layers 60, a first gate electrode pad 101, and a second gate electrode pad 102. In the third embodiment, similar to the first embodiment, the application timing of the first gate voltage (Vg1) and the second gate voltage (Vg2) are controlled by the control circuit 600.

First gate trenches 21 (first trenches), second gate trenches 22 (second trenches), a collector region 28 (first semiconductor region), a buffer region 30, a drift region 32 (second semiconductor region), a base region 34 (third semiconductor region), emitter regions 36 (fourth semiconductor regions), contact regions 38, first gate insulating films 41, second gate insulating films 42, first gate electrodes 51, second gate electrodes 52, a barrier region 70 (fifth semiconductor region), and a p-type region 80 (sixth semiconductor region) are provided in the semiconductor layer 10.

The barrier region 70 is an n-type semiconductor region. The barrier region 70 is provided between the drift region 32 and the base region 34. The concentration of n-type impurities in the barrier region 70 is higher than the concentration of n-type impurities in the drift region 32.

The p-type region 80 is a p-type semiconductor region. The p-type region 80 is provided between the drift region 32 and barrier region 70. As a result of providing the p-type region 80, destruction when the IGBT 300 is turned OFF is suppressed, and reliability is improved. Note that destruction when the IGBT 300 is turned OFF is suppressed by performing double gate drive and also by reducing the carrier concentration in the drift region 32.

Thus, the IGBT of the third embodiment enables the reduction of switching loss and the reduction of on-resistance similarly to the IGBT of the second embodiment. Further, destruction when the IGBT is turned OFF is suppressed, and reliability is improved.

Fourth Embodiment

A semiconductor circuit of a fourth embodiment includes a semiconductor device and a control circuit. The semiconductor device includes a semiconductor layer having a first plane and a second plane opposing the first plane, the semiconductor layer including, a first semiconductor region of a first-conductivity type, a second semiconductor region of a second-conductivity type provided between the first semiconductor region and the first plane, a third semiconductor region of the first-conductivity type provided between the second semiconductor region and the first plane, a fourth semiconductor region of the second-conductivity type provided between the third semiconductor region and the first plane, a fifth semiconductor region of the second-conductivity type provided between the second semiconductor region and the third semiconductor region, the fifth semiconductor region having a higher concentration of second-conductivity type impurities than the second semiconductor region, a first trench penetrating through the third semiconductor region and reaching into the second semiconductor region, a first gate electrode provided in the first trench, a first gate insulating film provided between the first gate electrode and the fourth semiconductor region, between the first gate electrode and the third semiconductor region, between the first gate electrode and the fifth semiconductor region, between the first gate electrode and the second semiconductor region, the first gate insulating film being in contact with the fourth semiconductor region, a second trench penetrating through the third semiconductor region and reaching into the second semiconductor region, and a second gate electrode provided in the second trench, a second gate insulating film provided between the second gate electrode and the fourth semiconductor region, between the second gate electrode and the third semiconductor region, between the second gate electrode and the fifth semiconductor region, between the second gate electrode and the second semiconductor region, the second gate insulating film being in contact with the fourth semiconductor region. Further, the semiconductor device includes a first electrode provided on a side of the first plane of the semiconductor layer and the first electrode being electrically connected to the fourth semiconductor region; a second electrode provided on a side of the second plane of the semiconductor layer and the second electrode being electrically connected to the first semiconductor region; a first gate electrode pad provided on the side of the first plane of the semiconductor layer, the first gate electrode pad being electrically connected to the first gate electrode, and a first gate voltage being applied to the first gate electrode pad; and a second gate electrode pad provided on the side of the first plane of the semiconductor layer, the second gate electrode pad being electrically connected to the second gate electrode, and a second gate voltage being applied to the second gate electrode pad. The control circuit configured to drive the semiconductor device, prior to changing the first gate voltage from a turn-ON voltage to a turn-OFF voltage by the control circuit, the second gate voltage being changed from a first voltage to a second voltage by the control circuit, the second voltage being a negative voltage in cases where the first-conductivity type being p-type, and the second voltage being a positive voltage in cases where the first-conductivity type being n-type.

The semiconductor circuit of the fourth embodiment differs from the semiconductor circuit of the second embodiment in that fourth semiconductor regions of the second-conductivity type are in contact with the second gate insulating films. In the following, details that overlap with that for the first embodiment or the second embodiment may be partially omitted.

Figure 9:
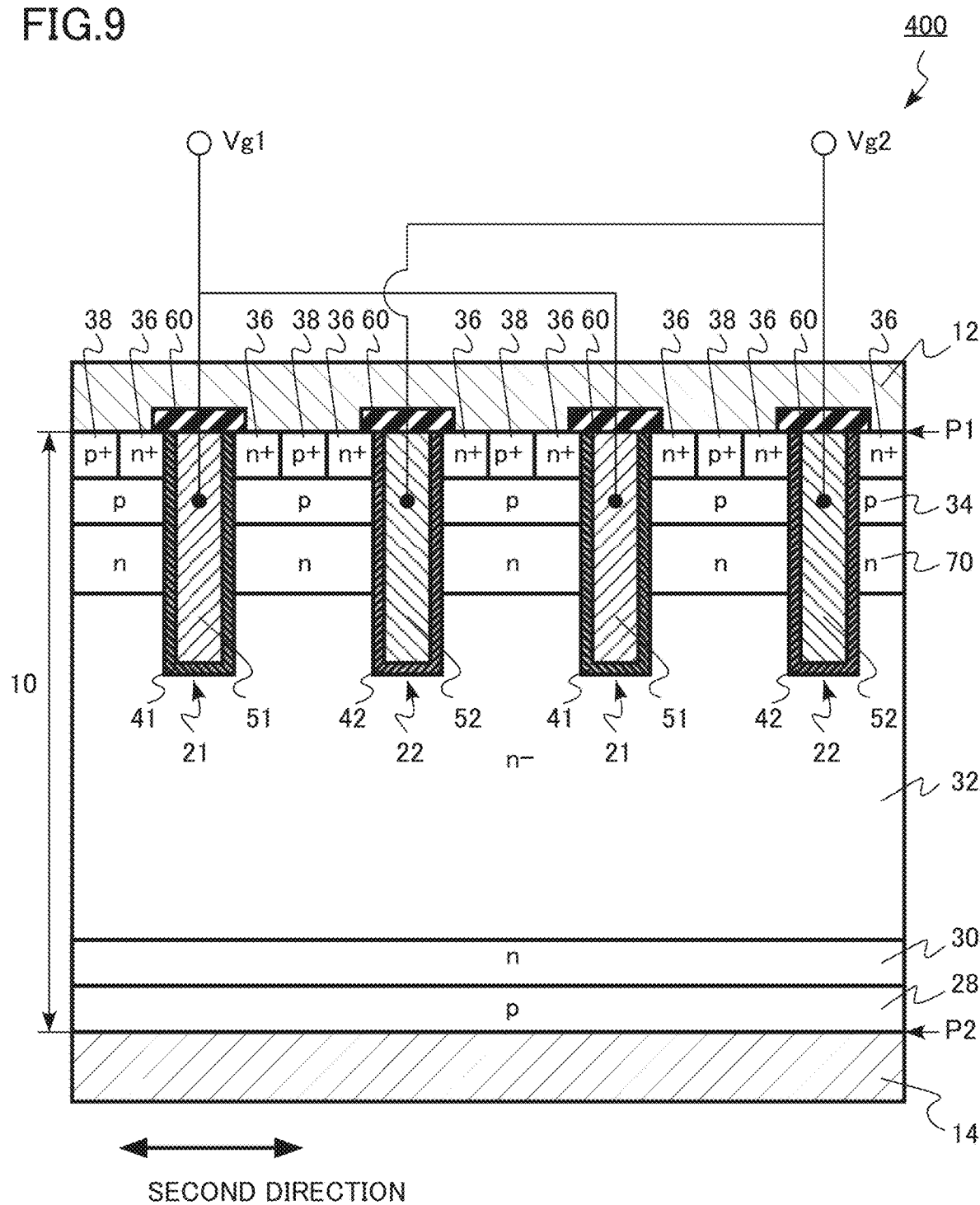
FIG. 9 is a schematic cross-sectional view of part of a semiconductor device of a fourth embodiment.
Figure 10:
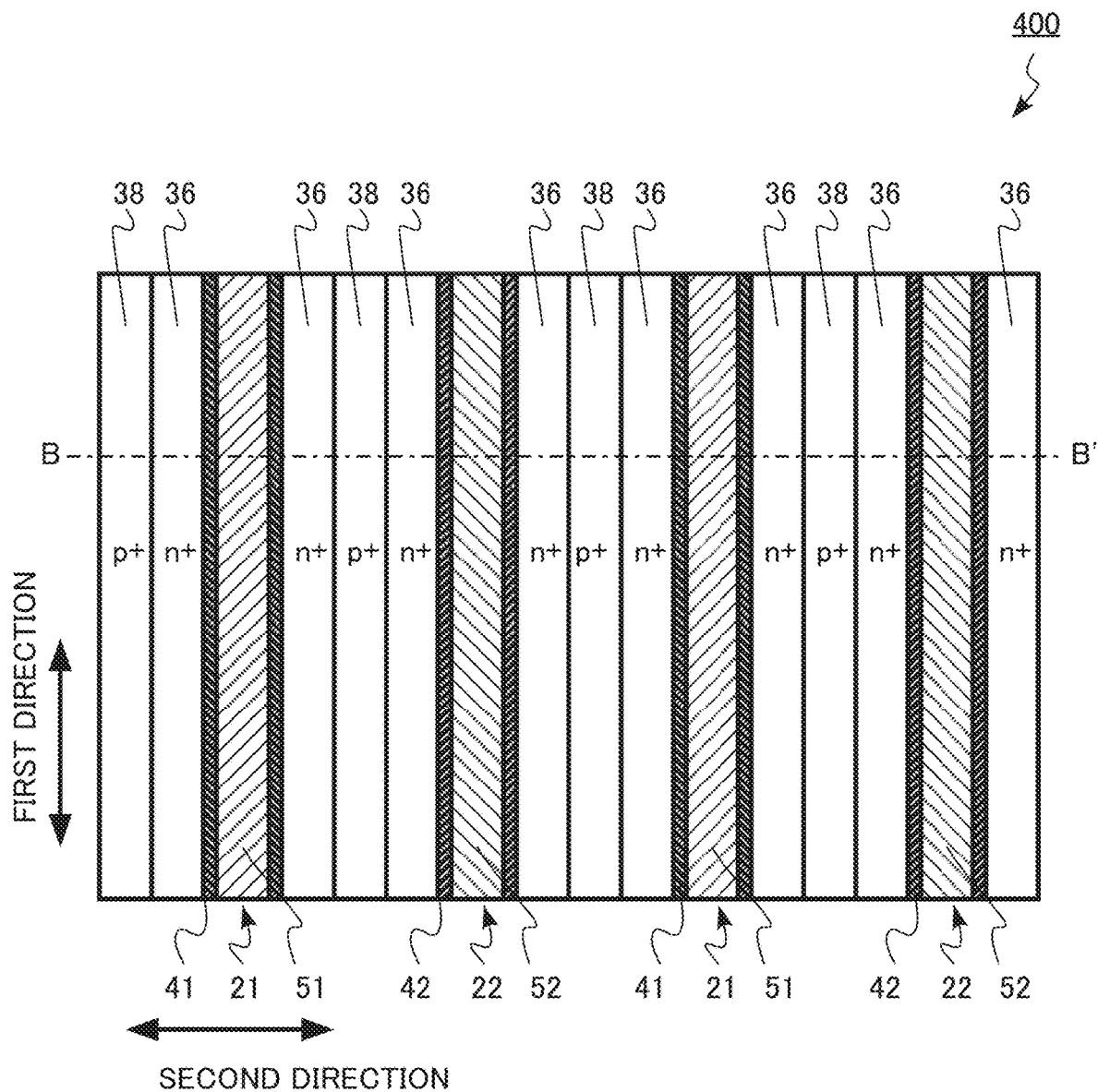
FIG. 10 is a schematic top view of part of the semiconductor device of the fourth embodiment.

FIG. 9 is a schematic cross-sectional view of part of the semiconductor device of the fourth embodiment. FIG. 10 is a schematic top view of part of the semiconductor device of the fourth embodiment. FIG. 10 is a top view of the first plane P1. FIG. 9 is a cross-section along BB' in FIG. 10.

The semiconductor device of the fourth embodiment is a trench-gate IGBT 400 provided with gate electrodes in trenches formed in a semiconductor layer. The semiconductor device of the fourth embodiment is an IGBT 400 with double gate driven configuration. In the following, an example will be described in which a first-conductivity type is p-type, and a second-conductivity type is n-type.

The IGBT 400 of the fourth embodiment is provided with a semiconductor layer 10, an emitter electrode 12 (first electrode), a collector electrode 14 (second electrode), insulating layers 60, a first gate electrode pad 101, and a second gate electrode pad 102.

First gate trenches 21 (first trenches), second gate trenches 22 (second trenches), a collector region 28 (first semiconductor region), a buffer region 30, a drift region 32 (second semiconductor region), a base region 34 (third semiconductor region), emitter regions 36 (fourth semiconductor regions), contact regions 38, first gate insulating films 41, second gate insulating films 42, first gate electrodes 51, second gate electrodes 52, and a barrier region 70 (fifth semiconductor region) are provided in the semiconductor layer 10.

The emitter regions 36 are n$^+$-type semiconductor regions. The emitter regions 36 are provided between the base region 34 and the first plane P1. The emitter regions 36 extend along a first direction at the first plane P1. The emitter regions 36 are in contact with the first gate insulating films 41 and the second gate insulating film 42. As shown in FIG. 9 and FIG. 10, one of the emitter regions 36 is in contact with one of the first gate insulating films 41, and another one of the emitter regions 36 is in contact with one of the second gate insulating films 42, for example. The concentration of n-type impurities in the emitter regions 36 is higher than the concentration of n-type impurities in the drift region 32.

The method of driving the IGBT 400 of the fourth embodiment is, for example, similar to the method of driving the IGBT 100 of the first embodiment.

Namely, prior to changing the first gate voltage (Vg1) from the turn-ON voltage (Von) to the turn-OFF voltage (Voff), namely prior to time t3, the second gate voltage (Vg2) is changed from the first voltage (V1) to a second voltage (V2). The voltage applied to the second gate electrode pad 102 is changed from the first voltage (V1) to the second voltage (V2) at time t2. In the fourth embodiment, similar to the first embodiment, the application timing of the first gate voltage (Vg1) and the second gate voltage (Vg2) are controlled by the control circuit 600.

The second voltage (V2) is a negative voltage. The second voltage (V2) is, for example, greater than or equal to −15 V and less than 0 V.

The first voltage (V1) is, for example, a voltage less than the turn-ON voltage (Von). The first voltage (V1) is, for example, a voltage less than the threshold voltage of the transistor including the second gate electrodes 52.

Note that it is also possible to have the first voltage (V1) be, for example, equal to the turn-ON voltage (Von). In such cases, since the emitter regions 36 is in contact with the second gate insulating films 42, in addition to the transistor including the first gate electrodes 51, the transistor including the second gate electrodes 52 also becomes the ON state.

The IGBT of the fourth embodiment enables the reduction of switching loss and the reduction of on-resistance similarly to the IGBT of the second embodiment.

Fifth Embodiment

The semiconductor circuit of the fifth embodiment differs from the semiconductor circuit of the fourth embodiment in that the pattern of the fourth semiconductor regions is different. In the following, details that overlap with that for the fourth embodiment may be partially omitted.

Figure 11:
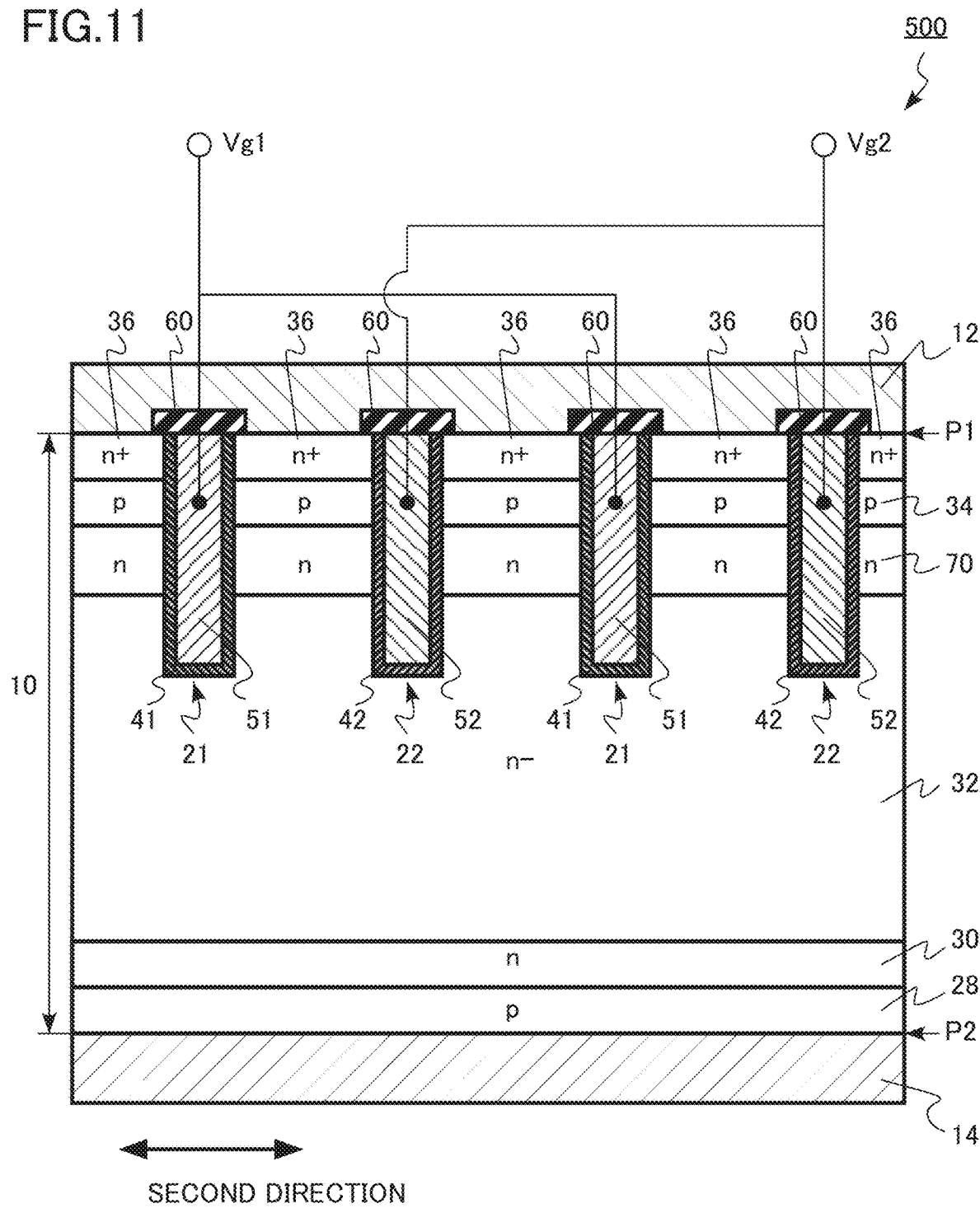
FIG. 11 is a schematic cross-sectional view of part of a semiconductor device of a fifth embodiment.
Figure 12:
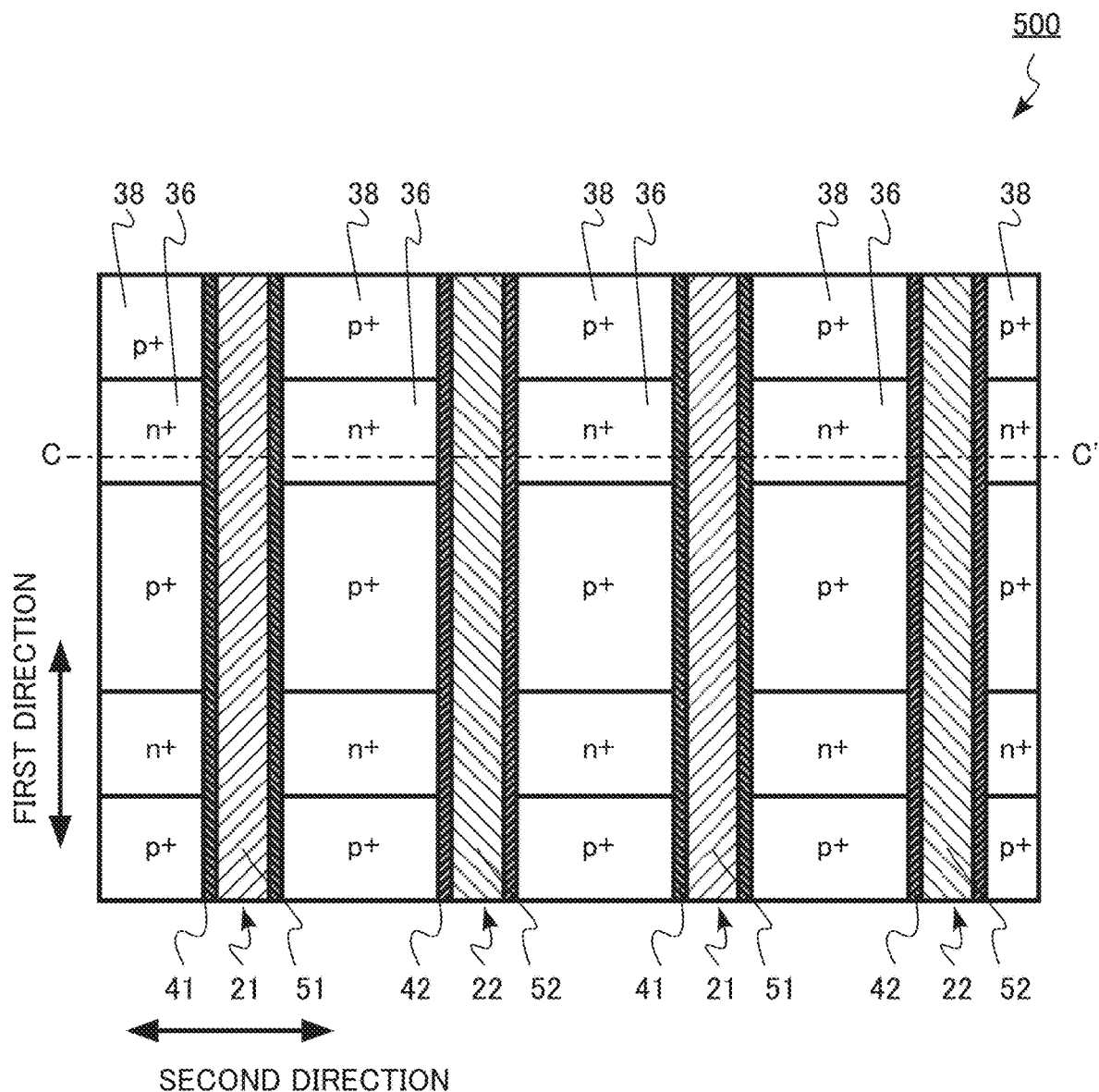
FIG. 12 is a schematic top view of part of the semiconductor device of the fifth embodiment.

FIG. 11 is a schematic cross-sectional view of part of the semiconductor device of the fifth embodiment. FIG. 12 is a schematic top view of part of the semiconductor device of the fifth embodiment. FIG. 12 is a top view of the first plane P1. FIG. 11 is a cross-section along CC' in FIG. 12.

The semiconductor device of the fifth embodiment is a trench-gate IGBT 500 provided with gate electrodes in trenches formed in a semiconductor layer. The semiconductor device of the fifth embodiment is an IGBT 500 with double gate driven configuration. In the following, an example will be described in which a first-conductivity type is p-type, and a second-conductivity type is n-type.

The IGBT 500 of the fifth embodiment is provided with a semiconductor layer 10, an emitter electrode 12 (first electrode), a collector electrode 14 (second electrode), insulating layers 60, a first gate electrode pad 101, and a second gate electrode pad 102.

First gate trenches 21 (first trenches), second gate trenches 22 (second trenches), a collector region 28 (first semiconductor region), a buffer region 30, a drift region 32 (second semiconductor region), a base region 34 (third semiconductor region), emitter regions 36 (fourth semiconductor regions), contact regions 38, first gate insulating films 41, second gate insulating films 42, first gate electrodes 51, second gate electrodes 52, and a barrier region 70 (fifth semiconductor region) are provided in the semiconductor layer 10.

The emitter regions 36 are n$^+$-type semiconductor regions. The emitter regions 36 are provided between the base region 34 and the first plane P1. The emitter regions 36 extend along a second direction at the first plane P1. The emitter regions 36 are disposed alternating with the contact regions 38 in the first direction at the first plane P1.

The emitter regions 36 are in contact with the first gate insulating films 41 and the second gate insulating film 42. The concentration of n-type impurities in the emitter regions 36 is higher than the concentration of n-type impurities in the drift region 32.

The method of driving the IGBT 500 of the fifth embodiment is, for example, similar to the method of driving the IGBT 400 of the fourth embodiment.

Thus, the IGBT of the fifth embodiment enables the reduction of switching loss and the reduction of on-resistance similarly to the IGBT of the fourth embodiment.

Although the first to the fifth embodiments were described using an example in which the semiconductor layer is single crystal silicon, the semiconductor layer is not limited to single crystal silicon. For example, the semiconductor layer may be single crystal silicon carbide or another single crystal semiconductor.

Although the first to the fifth embodiments were described using an example in which trenches have stripe shapes disposed in parallel, trenches with an intersecting mesh shape or with dot shapes may be employed in the present disclosure.

Although the first to the fifth embodiments were described using an example in which the first-conductivity type is p-type and the second-conductivity type is n-type, configuration may be such that the first-conductivity type is n-type and the second-conductivity type is p-type. In cases where the first-conductivity type is n-type and the second-conductivity type is p-type, for example, the second voltage (V2) will be a positive voltage.

While certain embodiments have been described, these embodiments have been presented by way of example only, and are not intended to limit the scope of the inventions. Indeed, the semiconductor circuit and control circuit described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor circuit comprising a semiconductor device and a control circuit,
   the semiconductor device comprising:
   a semiconductor layer having a first plane and a second plane opposing the first plane, the semiconductor layer including:
   a first semiconductor region of a first-conductivity type,
   a second semiconductor region of a second-conductivity type provided between the first semiconductor region and the first plane,
   a third semiconductor region of the first-conductivity type provided between the second semiconductor region and the first plane,
   a fourth semiconductor region of the second-conductivity type provided between the third semiconductor region and the first plane,
   a first trench penetrating through the third semiconductor region and reaching into the second semiconductor region,
   a first gate electrode provided in the first trench,
   a first gate insulating film provided between the first gate electrode and the fourth semiconductor region, between the first gate electrode and the third semiconductor region, between the first gate electrode and the second semiconductor region, the first gate insulating film being in contact with the fourth semiconductor region,
   a second trench penetrating through the third semiconductor region and reaching into the second semiconductor region,
   a second gate electrode provided in the second trench, and
   a second gate insulating film provided between the second gate electrode and the third semiconductor region between the second gate electrode and the second semiconductor region, the second gate insulating film being spaced away from the fourth semiconductor region;
   a first electrode provided on a side of the first plane of the semiconductor layer and the first electrode being electrically connected to the fourth semiconductor region;
   a second electrode provided on a side of the second plane of the semiconductor layer and the second electrode being electrically connected to the first semiconductor region;
   a first gate electrode pad provided on the side of the first plane of the semiconductor layer, the first gate electrode pad being electrically connected to the first gate electrode, and a first gate voltage being applied to the first gate electrode pad; and
   a second gate electrode pad provided on the side of the first plane of the semiconductor layer, the second gate electrode pad being electrically connected to the second gate electrode, and a second gate voltage being applied to the second gate electrode pad;
   the control circuit configured to drive the semiconductor device, the control circuit configured to begin changing the first gate voltage from a turn-ON voltage to a turn-OFF voltage at a first time, the control circuit configured to begin changing the second gate voltage from a first voltage to a second voltage at a second time prior to the first time, the second voltage being a negative voltage in cases where the first-conductivity type being p-type, and the second voltage being a positive voltage in cases where the first-conductivity type being n-type.

2. The semiconductor circuit according to claim 1, the semiconductor layer further including a fifth semiconductor region of the second-conductivity type provided between the second semiconductor region and the third semiconductor region, the fifth semiconductor region having a higher concentration of second-conductivity type impurities than the second semiconductor region.

3. The semiconductor circuit according to claim 2, the semiconductor layer further including a sixth semiconductor region of the first-conductivity type provided between the second semiconductor region and the fifth semiconductor region.

4. The semiconductor circuit according to claim 1, wherein as a result of applying the second voltage to the second gate electrode pad, an inversion layer is formed in the second semiconductor region in contact with the second gate insulating film.

5. The semiconductor circuit according to claim 2, wherein as a result of applying the second voltage to the second gate electrode pad, an inversion layer is formed in the fifth semiconductor region in contact with the second gate insulating film.

6. The semiconductor circuit according to claim 1, wherein the first-conductivity type is p-type and the first voltage is a positive voltage.

7. The semiconductor circuit according to claim 1, wherein a time interval between a time when the second gate voltage being changed from a first voltage to a second voltage and a time when the first gate voltage being changed from a turn-ON voltage to a turn-OFF voltage is equal to or more than 0.1 µs and equal to or less than 4 µs.

8. A semiconductor circuit comprising a semiconductor device and a control circuit,
the semiconductor device comprising:
a semiconductor layer having a first plane and a second plane opposing the first plane, the semiconductor layer including:
a first semiconductor region of a first-conductivity type,
a second semiconductor region of a second-conductivity type provided between the first semiconductor region and the first plane,
a third semiconductor region of the first-conductivity type provided between the second semiconductor region and the first plane,
a fourth semiconductor region of the second-conductivity type provided between the third semiconductor region and the first plane,
a fifth semiconductor region of the second-conductivity type provided between the second semiconductor region and the third semiconductor region, the fifth semiconductor region having a higher concentration of second-conductivity type impurities than the second semiconductor region,
a first trench penetrating through the third semiconductor region and reaching into the second semiconductor region,
a first gate electrode provided in the first trench,
a first gate insulating film provided between the first gate electrode and the fourth semiconductor region, between the first gate electrode and the third semiconductor region, between the first gate electrode and the fifth semiconductor region, between the first gate electrode and the second semiconductor region, the first gate insulating film being in contact with the fourth semiconductor region,
a second trench penetrating through the third semiconductor region and reaching into the second semiconductor region,
a second gate electrode provided in the second trench, and
a second gate insulating film provided between the second gate electrode and the fourth semiconductor region, between the second gate electrode and the third semiconductor region, between the second gate electrode and the fifth semiconductor region, between the second gate electrode and the second semiconductor region, the second gate insulating film being in contact with the fourth semiconductor region;
a first electrode provided on a side of the first plane of the semiconductor layer and the first electrode being electrically connected to the fourth semiconductor region;
a second electrode provided on a side of the second plane of the semiconductor layer and the second electrode being electrically connected to the first semiconductor region;
a first gate electrode pad provided on the side of the first plane of the semiconductor layer, the first gate electrode pad being electrically connected to the first gate electrode, and a first gate voltage being applied to the first gate electrode pad; and
a second gate electrode pad provided on the side of the first plane of the semiconductor layer, the second gate electrode pad being electrically connected to the second gate electrode, and a second gate voltage being applied to the second gate electrode pad;
the control circuit configured to drive the semiconductor device, prior to changing the first gate voltage from a turn-ON voltage to a turn-OFF voltage by the control circuit, the second gate voltage being changed from a first voltage to a second voltage by the control circuit, the second voltage being a negative voltage in cases where the first-conductivity type being p-type, and the second voltage being a positive voltage in cases where the first-conductivity type being n-type.

9. The semiconductor circuit according to claim 8, wherein as a result of applying the second voltage to the second gate electrode pad, an inversion layer is formed in the fifth semiconductor region in contact with the second gate insulating film.

10. The semiconductor circuit according to claim 8, the semiconductor layer further including a sixth semiconductor region of the first-conductivity type provided between the second semiconductor region and the fifth semiconductor region.

11. The semiconductor circuit according to claim 8, wherein the first-conductivity type is p-type and the first voltage is a positive voltage.

12. The semiconductor circuit according to claim 8, wherein a time interval between a time when the second gate voltage being changed from a first voltage to a second voltage and a time when the first gate voltage being changed from a turn-ON voltage to a turn-OFF voltage is equal to or more than 0.1 µs and equal to or less than 4 µs.

13. A control circuit configured to drive a semiconductor device,
the semiconductor device comprising:
a semiconductor layer having a first plane and a second plane opposing the first plane, the semiconductor layer including:
a first semiconductor region of a first-conductivity type,
a second semiconductor region of a second-conductivity type provided between the first semiconductor region and the first plane,
a third semiconductor region of the first-conductivity type provided between the second semiconductor region and the first plane,
a fourth semiconductor region of the second-conductivity type provided between the third semiconductor region and the first plane,
a first trench penetrating through the third semiconductor region and reaching into the second semiconductor region,
a first gate electrode provided in the first trench,
a first gate insulating film provided between the first gate electrode and the fourth semiconductor region, between the first gate electrode and the third semiconductor region, between the first gate electrode and the second semiconductor region, the first gate insulating film being in contact with the fourth semiconductor region,
a second trench penetrating through the third semiconductor region and reaching into the second semiconductor region,
a second gate electrode provided in the second trench, and a second gate insulating film provided between the second gate electrode and the third semiconductor region between the second gate electrode and the second semiconductor region, the second gate insulating film being spaced away from the fourth semiconductor region;

a first electrode provided on a side of the first plane of the semiconductor layer and the first electrode being electrically connected to the fourth semiconductor region;

a second electrode provided on a side of the second plane of the semiconductor layer and the second electrode being electrically connected to the first semiconductor region;

a first gate electrode pad provided on the side of the first plane of the semiconductor layer, the first gate electrode pad being electrically connected to the first gate electrode, and a first gate voltage being applied to the first gate electrode pad; and a second gate electrode pad provided on the side of the first plane of the semiconductor layer, the second gate electrode pad being electrically connected to the second gate electrode, and a second gate voltage being applied to the second gate electrode pad;

the control circuit configured to begin changing the first gate voltage from a turn-ON voltage to a turn-OFF voltage at a first time, the control circuit configured to begin changing the second gate voltage from a first voltage to a second voltage at a second time prior to the first time, the second voltage being a negative voltage in cases where the first-conductivity type being p-type, and the second voltage being a positive voltage in cases where the first-conductivity type being n-type.

* * * * *